(12) United States Patent
Jia et al.

(10) Patent No.: US 11,937,466 B2
(45) Date of Patent: Mar. 19, 2024

(54) DISPLAY PANEL AND DISPLAY DEVICE

(71) Applicant: KunShan Go-Visionox Opto-Electronics Co., Ltd., Suzhou (CN)

(72) Inventors: Xiyang Jia, Suzhou (CN); Jianlong Wu, Suzhou (CN); Zhengyong Zhu, Suzhou (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 390 days.

(21) Appl. No.: 17/365,194

(22) Filed: Jul. 1, 2021

(65) Prior Publication Data
US 2021/0328000 A1 Oct. 21, 2021

Related U.S. Application Data

(63) Continuation of application No. PCT/CN2020/074965, filed on Feb. 12, 2020.

(30) Foreign Application Priority Data

Jun. 10, 2019 (CN) .......................... 201910498659.7

(51) Int. Cl.
*H10K 59/126* (2023.01)
*G09G 3/3225* (2016.01)
(Continued)

(52) U.S. Cl.
CPC ......... *H10K 59/126* (2023.02); *G09G 3/3225* (2013.01); *H01L 29/78633* (2013.01); *H10K 59/131* (2023.02); *G09G 2320/0214* (2013.01)

(58) Field of Classification Search
CPC .... H10K 59/126; H10K 59/131; H10K 59/12; G09G 3/3225; G09G 2320/0214
See application file for complete search history.

(56) References Cited

U.S. PATENT DOCUMENTS

2012/0162275 A1 6/2012 Park
2018/0122888 A1* 5/2018 Jung .................. H10K 59/1216

FOREIGN PATENT DOCUMENTS

CN 104145213 A 11/2014
CN 105336295 A 2/2016
(Continued)

OTHER PUBLICATIONS

Chinese First Office Action for Application No. 201910498659.7 dated Feb. 2, 2021., 20 pgs.
(Continued)

*Primary Examiner* — Earl N Taylor
(74) *Attorney, Agent, or Firm* — Maier & Maier, PLLC

(57) ABSTRACT

A display panel includes a substrate; a first metal layer comprising a gate of a driving transistor; a second metal layer comprising a capacitor plate of a storage capacitor; a third metal layer, located on one side of the second metal layer away from the substrate and comprising a data line. An orthographic projection of the data line on the substrate is non-overlapped with the orthographic projection of the gate projected on the substrate; and a first shielding electrode, having a fixed potential. A part of the orthographic projection of the gate projected on the substrate is located in an orthographic projection of the first shielding electrode projected on the substrate, and the rest part of the orthographic projection of the gate projected on the substrate is located in the orthographic projection of the capacitor plate projected on the substrate.

20 Claims, 6 Drawing Sheets

(51) Int. Cl.
    *H01L 29/786*     (2006.01)
    *H10K 59/131*     (2023.01)

(56) References Cited

FOREIGN PATENT DOCUMENTS

| | | |
|---|---|---|
| CN | 106952940 A | 7/2017 |
| CN | 108597374 A | 9/2018 |
| CN | 109272930 A | 1/2019 |
| CN | 109360851 A | 2/2019 |
| CN | 109410778 A | 3/2019 |
| CN | 109742092 A | 5/2019 |
| CN | 110299384 A | 10/2019 |

OTHER PUBLICATIONS

International search report for Application No. PCT/CN2020/074965 dated May 6, 2020., 13 pgs.

\* cited by examiner

DISPLAY PANEL AND DISPLAY DEVICE

CROSS REFERENCE

The present application is a continuation-application of International (PCT) Patent Application No. PCT/CN2020/074965, filed on Feb. 12, 2020, which claims foreign priority of Chinese Patent Application No. 201910498659.7, in the title of "Display Panel", filed on Jun. 10, 2019, in the National Intellectual Property Administration of China, the entire contents of which are hereby incorporated by reference in its entirety.

TECHNICAL FIELD

The present disclosure relates to the field of displaying technology, and in particular to a display panel and a display device.

BACKGROUND

For an organic light-emitting diode (OLED) display panel, a gray scale of display is determined by a gate potential of a driving transistor. There is no overlapping capacitance between the gate of the driving transistor and a data line, but a lateral parasitic capacitance between the gate and the data line is unavoidable. As a resolution of the display panel improving, layout space for pixels becomes smaller and smaller, and the parasitic capacitance between the gate of the driving transistor and the data line becomes larger. The voltage changes in the data line will be coupled to the gate of the driving transistor, thereby causing crosstalk.

For this reason, with the improvement of the resolution of the display panel, the crosstalk existing between the gate of the driving transistor and the data line needs to be solved urgently.

SUMMARY OF THE DISCLOSURE

In some embodiments of the present disclosure, a display panel and a display device are provided, which can reduce the coupling capacitance between the gate of the driving transistor and the data line, and further reduce the crosstalk.

One technical solution provided in some embodiments of the present disclosure is to provide a display panel. The display panel comprises a substrate; a first metal layer, located on one side of the substrate and comprising a gate of a driving transistor; a second metal layer, located on one side of the first metal layer away from the substrate and comprising a capacitor plate of a storage capacitor, wherein an orthographic projection of the first capacitor plate projected on the substrate is partially overlapped with an orthographic projection of the gate projected on the substrate; a third metal layer, located on one side of the second metal layer away from the substrate and comprising a data line, wherein an orthographic projection of the data line on the substrate is non-overlapped with the orthographic projection of the gate projected on the substrate; and a first shielding electrode, having a fixed potential, wherein a part of the orthographic projection of the gate projected on the substrate is located in an orthographic projection of the first shielding electrode projected on the substrate, and the rest part of the orthographic projection of the gate projected on the substrate is located in the orthographic projection of the capacitor plate projected on the substrate.

Another technical solution provided in some embodiments of the present disclosure is to provide a display device, and the display device comprises the display panel as previously described.

A further technical solution provided in some embodiments of the present disclosure is to provide a display panel. The display panel comprises a substrate, a driving transistor, having a gate disposed on the substrate; a capacitor plate of a storage capacitor, located on one side of the gate away from the substrate; and a shielding electrode, having a fixed potential, wherein a part of the orthographic projection of the gate projected on the substrate is located in an orthographic projection of the shielding electrode projected on the substrate, and the rest part of the orthographic projection of the gate projected on the substrate is located in the orthographic projection of the capacitor plate projected on the substrate.

The technical effect provided in some embodiments of the present disclosure may include the following. The display panel includes a first shielding electrode having a fixed potential. A part of the orthographic projection of the gate of the driving transistor is located in the orthographic projection of the first shielding electrode projected on the substrate, and the rest part of the orthographic projection of the gate projected on the substrate is located in the orthographic projection of the capacitor plate projected on the substrate. The lateral coupling capacitance between the data line and the gate of the driving transistor is shielded by a coupling capacitance between the gate and the first shielding electrode. In this way, an influence on a voltage of the gate of the driving transistor by a voltage change in the data line will be mitigated. Besides, since the first shielding electrode has a fixed potential and the fixed potential of the first shielding electrode is not easily coupled to change during the operation of the display panel, the voltage of the gate of the driving transistor will be kept in a waveform as stable as possible, and the crosstalk will be mitigated.

DETAILED DESCRIPTION

The technical solutions of the present application will be described clearly and completely with the accompanying drawings in the embodiments of the present application. Obviously, the described embodiments are only a part of the embodiments of the present application, rather than all the embodiments. Based on the embodiments in the present disclosure, all other embodiments obtained by those of ordinary skill in the art without creative work shall fall within the protection scope of the present disclosure.

Figure 1:
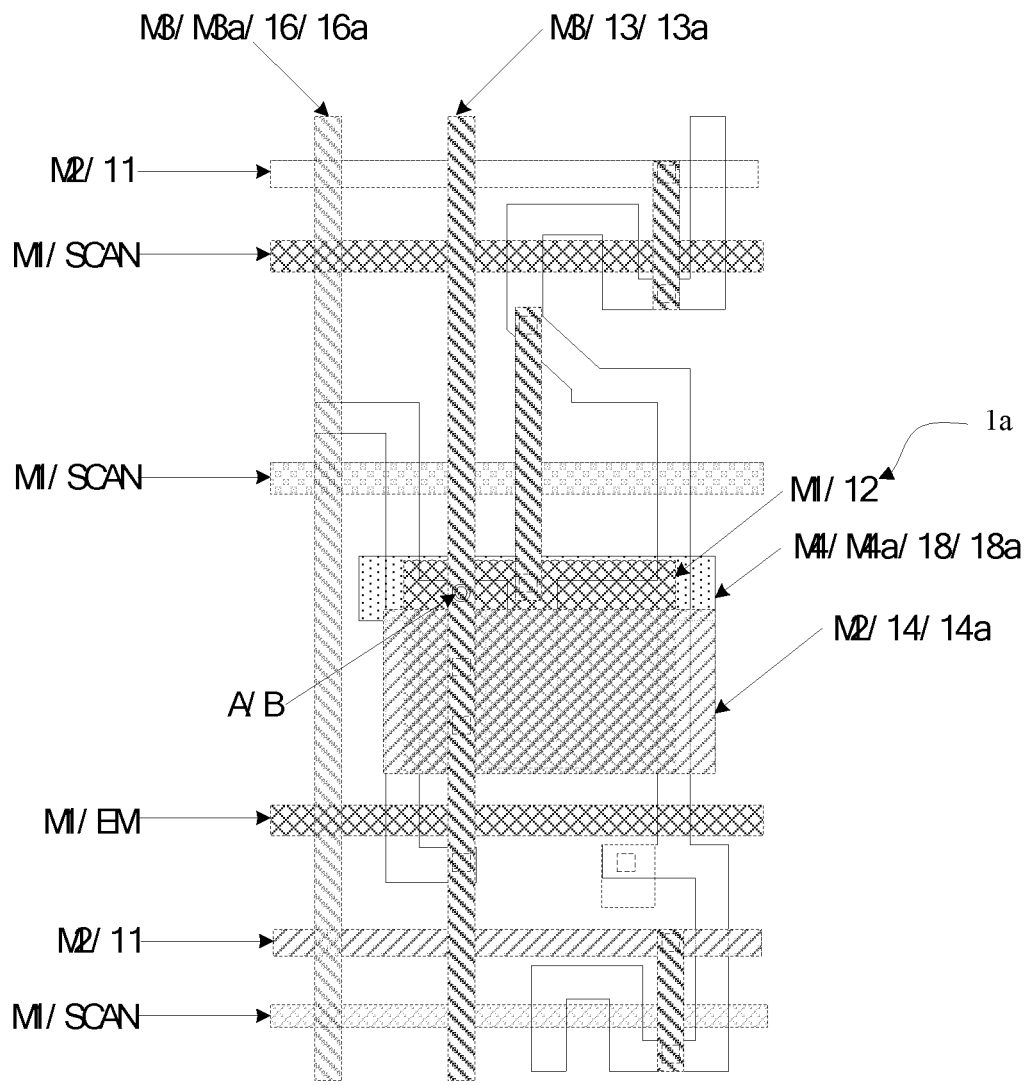
FIG. 1 is a schematic plan view of a display panel according to an embodiment of the present disclosure.
Figure 2:
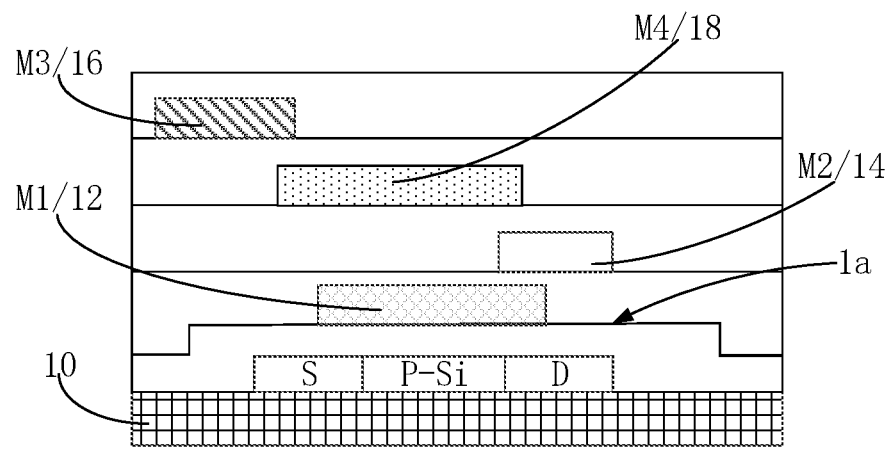
FIG. 2 is a schematic cross-sectional view of the display panel according to an embodiment showing in FIG. 1.

FIG. 1 is a schematic plan view of a display panel according to an embodiment of the present disclosure, and FIG. 2 is a schematic cross-sectional view of the display panel according to an embodiment showing in FIG. 1. As shown in FIGS. 1-2, the display panel includes a substrate 10 (shown in FIG. 2), a first metal layer M1, a second metal layer M2, a third metal layer M3, and a first shielding electrode 18. In some embodiments, the display panel includes at least one driving transistor 1a.

Specifically, the substrate 10 may be a hard substrate or a flexible substrate. The hard substrate may be a glass substrate, a silicon substrate, etc. The material of the flexible substrate may be polyimide or the like.

The first metal layer M1 is located on one side of the substrate 10, and the material of the first metal layer M1 may be molybdenum M0 or the like. The first metal layer M1 includes a gate 12 of the driving transistor 1a. In this embodiment, the first metal layer M1 may also include other components, such as gates of other switching transistors, a plurality of scan lines (SCAN), and a capacitor plate of a storage capacitor (for example, a lower capacitor plate), etc.

The second metal layer M2 is located on one side of the first metal layer M1 away from the substrate 10. The first metal layer M1 and the second metal layer M2 can be separated from each other by an insulating layer. The material of the second metal layer M2 may be molybdenum M0 or the like. The second metal layer M2 includes a capacitor plate 14 (for example, an upper capacitor plate) of the storage capacitor. An orthographic projection of the first capacitor plate 14 projected on the substrate 10 is partially overlapped with an orthographic projection of the gate 12 projected on the substrate 10; that is, in a direction substantially perpendicular to a paper direction of FIG. 1, the first capacitor plate 14 only covers a part of the gate electrode 12. Surely, in this embodiment, the second metal layer M2 may also include other components, such as a reference voltage line 11 and the like.

The third metal layer M3 is located on one side of the second metal layer M2 away from the substrate 10. The third metal layer M3 and the second metal layer M2 can be separated from each other by an insulating layer. The material of the third metal layer M3 may be aluminum Al or the like. The third metal layer M3 includes a data line 16. An orthographic projection of the data line 16 projected on the substrate 10 is non-overlapped with the orthographic projection of the gate electrode 12 projected on the substrate 10. In this embodiment, the third metal layer M3 may also include other components, such as a power supply voltage line 13 and the like.

The first shielding electrode 18 has a fixed potential. The orthographic projection of the gate 12 projected on the substrate 10 is located in an orthographic projection of the first shielding electrode 18 projected on the substrate 10 and the orthographic projection of the capacitor plate 14 projected on the substrate 10. That is, in the direction substantially perpendicular to the paper direction of FIG. 1, the capacitor plate 14 only covers a part of the gate 12 of the driving transistor, and an area of the gate 12 of the driving transistor protruding out of the capacitor plate 14 is covered by the first shielding electrode 18. That is, a part of the orthographic projection of the gate 12 projected on the substrate 10 is located in the orthographic projection of the first shielding electrode 18 projected on the substrate 10, and the rest part of the orthographic projection of the gate 12 projected on the substrate 10 is located in the orthographic projection of the capacitor plate 14 projected on the substrate 10. The material of the first shielding electrode 18 may be molybdenum M0, aluminum Al, or the like.

Through the above design, the lateral coupling capacitance between the data line 16 and the gate 12 of the driving transistor is shielded by a coupling capacitance between the gate 12 and the first shielding electrode 18. In this way, an influence on a voltage of the gate 12 of the driving transistor by a voltage change in the data line 16 will be mitigated. Besides, since the first shielding electrode 18 has a fixed potential and the fixed potential of the first shielding electrode 18 is not easily coupled to change during the operation of the display panel, the voltage of the gate 12 of the driving transistor will be kept in a waveform as stable as possible, and the crosstalk will be mitigated.

In one embodiment, the first shielding electrode 18 is connected to the power supply voltage line 13, and the power supply voltage line 13 receives a constant DC voltage signal. Because the DC voltage signal is not easy to change during the operation of the display panel, the voltage of the gate 12 of the driving transistor will be kept in a waveform as stable as possible, and the crosstalk will be mitigated.

In an application scenario, as further shown in FIG. 1 and FIG. 2, the first shielding electrode 18 is located in a fourth metal layer M4, and the fourth metal layer M4 is located between the third metal layer M3 and the second metal layer M2. The fourth metal layer M4 and the third metal layer M3 are separated from each other by an insulating layer, and the fourth metal layer M4 and the second metal layer M2 are separated from each other by an insulating layer. An overlapping area (not labeled) exists between the orthographic projection of the first shielding electrode 18 projected on the substrate 10 and the orthographic projection of the power supply voltage line 13 projected on the substrate 10. The first shielding electrode 18 and the power supply voltage line 13 are interconnected through a first connecting hole A. An orthographic projection of the first connecting hole A projected on the substrate 10 is located in the overlapping area. The first connection hole A may be filled with conductive material, so that the first shielding electrode 18 can be electrically connected to the power supply voltage line 13. The fixed potential of the first shielding electrode 18 is the power supply voltage. The above-mentioned design about the first shielding electrode 18 is relatively simple, and the implementation is easy.

Figure 3:
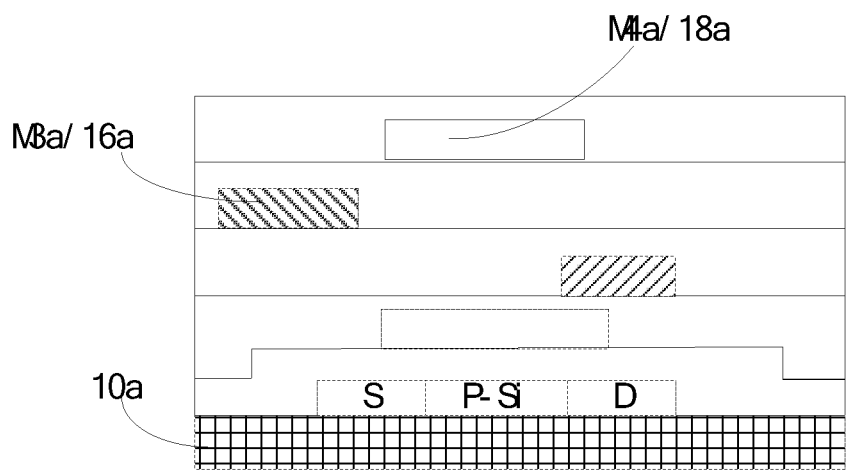
FIG. 3 is a schematic cross-sectional view of the display panel according to another embodiment showing in FIG. 1.

FIG. 3 is a schematic cross-sectional view of the display panel according to an embodiment showing in FIG. 1. In another application scenario, please refer to FIG. 1 and FIG. 3, a first shielding electrode 18a is located in a fourth metal layer M4a, and the fourth metal layer M4a is located on one side of a third metal layer M3a away from a substrate 10a. An overlapping area exists between the orthographic projection of the first shielding electrode 18a projected on the substrate 10 and the orthographic projection of a power supply voltage line 13a projected on the substrate 10a. The first shielding electrode 18a and the power supply voltage line 13a are interconnected through a second connection hole B. An orthographic projection of the second connection hole B projected on the substrate 10a is located in the overlapping area. The second connection hole B may be filled with conductive material, so that the first shielding electrode 18a can be electrically connected to the power supply voltage line 13a. The fixed potential of the first shielding electrode 18a is the power supply voltage. The above-mentioned design of the first shielding electrode 18a is relatively simple, and the implementation is easy to easy.

Figure 4:
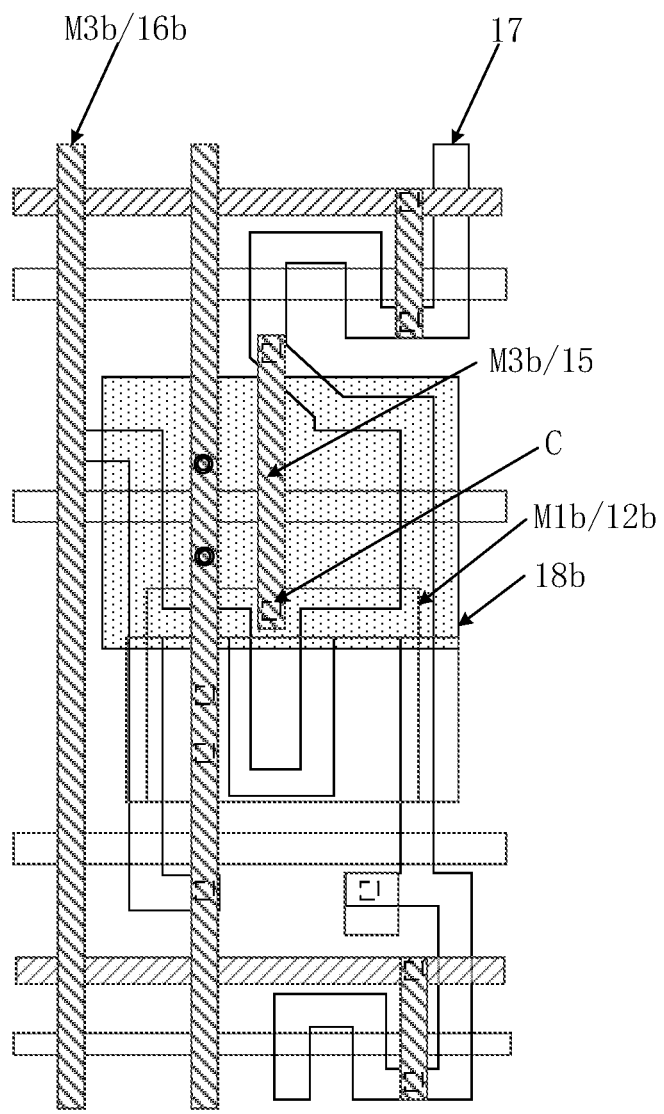
FIG. 4 is a schematic plan view of a display panel according to an embodiment of the present disclosure.
Figure 5:
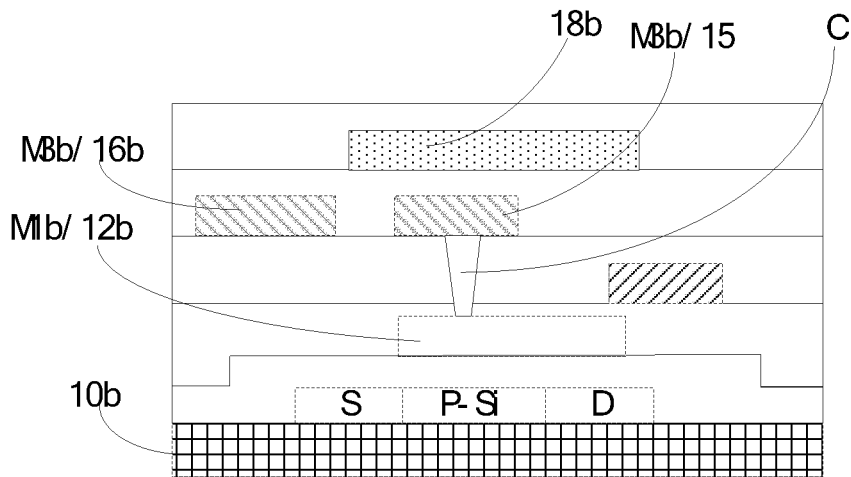
FIG. 5 is a schematic cross-sectional view of the display panel according to another embodiment showing in FIG. 4.

FIG. 4 is a schematic plan view of a display panel according to another embodiment of the present disclosure, and FIG. 5 is a schematic cross-sectional view of the display panel according to an embodiment showing in FIG. 4. In another embodiment, please refer to FIGS. 4-5, the difference between the display panel in this embodiment and the display panel in the embodiment showing in FIG. 3 is that, the display panel provided by this embodiment further includes a first connecting wire 15. The first connecting wire 15 is located in a third metal layer M3b and connected to a gate 12b through a third connecting hole C. The orthographic projection of a shielding electrode 18b projected on a substrate 10b is also at least partially overlapped with an orthographic projection of the first connecting line 15 projected on the substrate 10b. The first connection line 15 is connected to the gate 12b, the potential of the first connection line 15 is substantially the same as the potential of the gate 12b. A lateral coupling capacitance exists between the first connection line 15 and a data line 16b, and the voltage change in the data line 16b will be coupled to the first connection line 15, thereby affecting the gate 12b of the driving transistor. In this case, through the above design, the lateral coupling capacitance between the data line 16b and the first connection line 15 is shielded by the coupling capacitance between the first connection line 15 and the first shielding electrode 18b. In this way, the influence on the first connection line 15 by the voltage change in the data line 16b will be mitigated, and the influence on the gate 12b of the driving transistor will also be mitigated.

Figure 6:
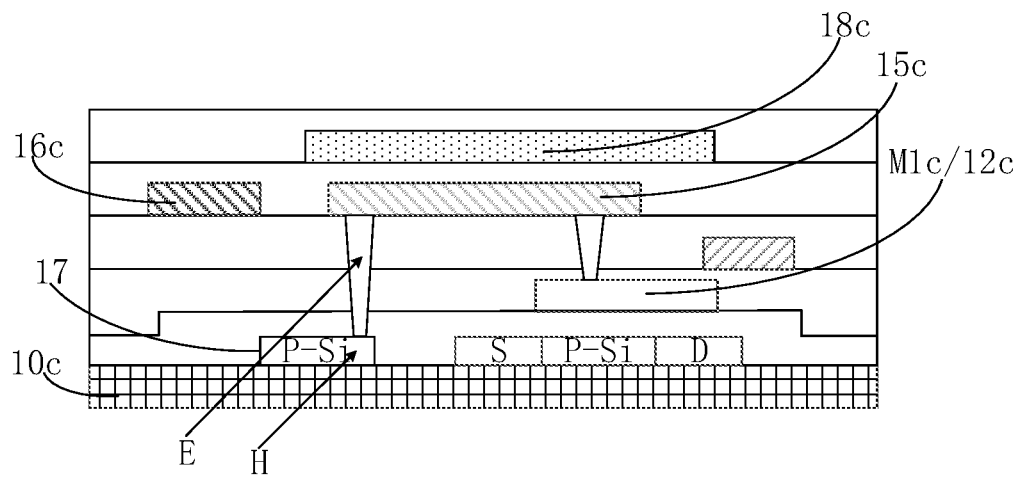
FIG. 6 is a schematic cross-sectional view of the display panel according to another embodiment showing in FIG. 4.

FIG. 6 is a schematic cross-sectional view of the display panel according to another embodiment showing in FIG. 4. In yet another embodiment, please refer to FIG. 6, the difference between the display panel in this embodiment and the display panel in the embodiment showing in FIG. 5 is that the display panel further includes a semiconductor layer 17. The semiconductor layer 17 may include a source S, a drain D, etc. of the driving transistor. The semiconductor layer 17 may be located between a substrate 10c and a first metal layer M1c, and includes a first area H. The first area H is connected to a first connecting line 15c by a fourth connecting hole E. In some embodiments, the orthographic projection of the first shielding electrode 18c projected on the substrate 10c is also at least partially overlapped with the orthographic projection of the first area H projected on the substrate 10c. The first area H is connected to a gate electrode 12c through a first connection line 15c, and the potential of the first area H is substantially the same as the potential of the gate electrode 12c. A lateral coupling capacitance exists between the first area H and a data line 16c or other signal lines, and the voltage change in the data line 16c or other signal lines will be coupled to the first area H, thereby affecting the gate 12c of the driving transistor. In this case, however, through the above design, the lateral coupling capacitance between the data line 16c or other signal lines and the first area H is shielded by the coupling capacitance between the first area H and the first shielding electrode 18c. In this way, the influence on the first area H by the voltage changes in the data line 16c or other signal lines will be mitigated, and the influence on the gate electrode 12c of the driving transistor will be mitigated.

Figure 7:
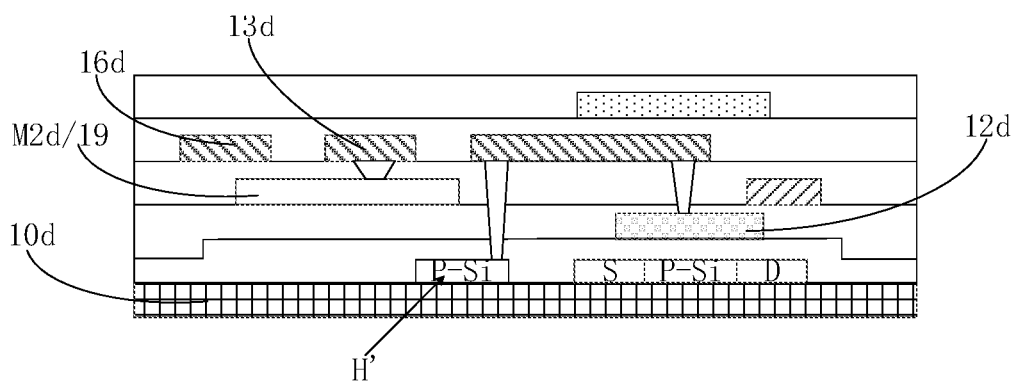
FIG. 7 is a schematic plan view of a display panel according to another embodiment of the present disclosure.

In other embodiments, the first area H' in the above embodiments can also be shielded by using a second shielding electrode 19. FIG. 7 is a schematic cross-sectional view of a display panel according to another embodiment of the present disclosure. As shown in FIG. 7, the second shielding electrode 19 is located in a second metal layer M2d, and the second shielding electrode 19 can be formed when the second metal layer M2d is patterning. That is, the second shielding electrode 19 is formed by patterning the second metal layer M2d. The second shielding electrode 19 is connected to a power supply voltage line 13d. For example, an overlapping area exists between the orthographic projection of the second shielding electrode 19 projected on the substrate 10d and the orthographic projection of the power supply voltage line 13d projected on the substrate 10d. The second shielding electrode 19 and the power supply voltage line 13d can be directly connected to each other by a connection hole. At this time, the second shielding electrode 19 has a fixed potential, and the fixed potential is the power supply voltage. The orthographic projection of the second shielding electrode 19 projected on the substrate 10d is at least partially overlapped with the orthographic projection of the first area H' projected on the substrate 10d. Through the above design, the lateral coupling capacitance between the first area H' and the data line 16d or other signal lines is shielded by the coupling capacitance between the first area H' and the second shielding electrode 19. In this way, the influence on the first area H' by the voltage changes in the data line 16d or other signal lines will be mitigated, and the influence on the gate electrode 12d of the driving transistor will be mitigated.

Figure 8:
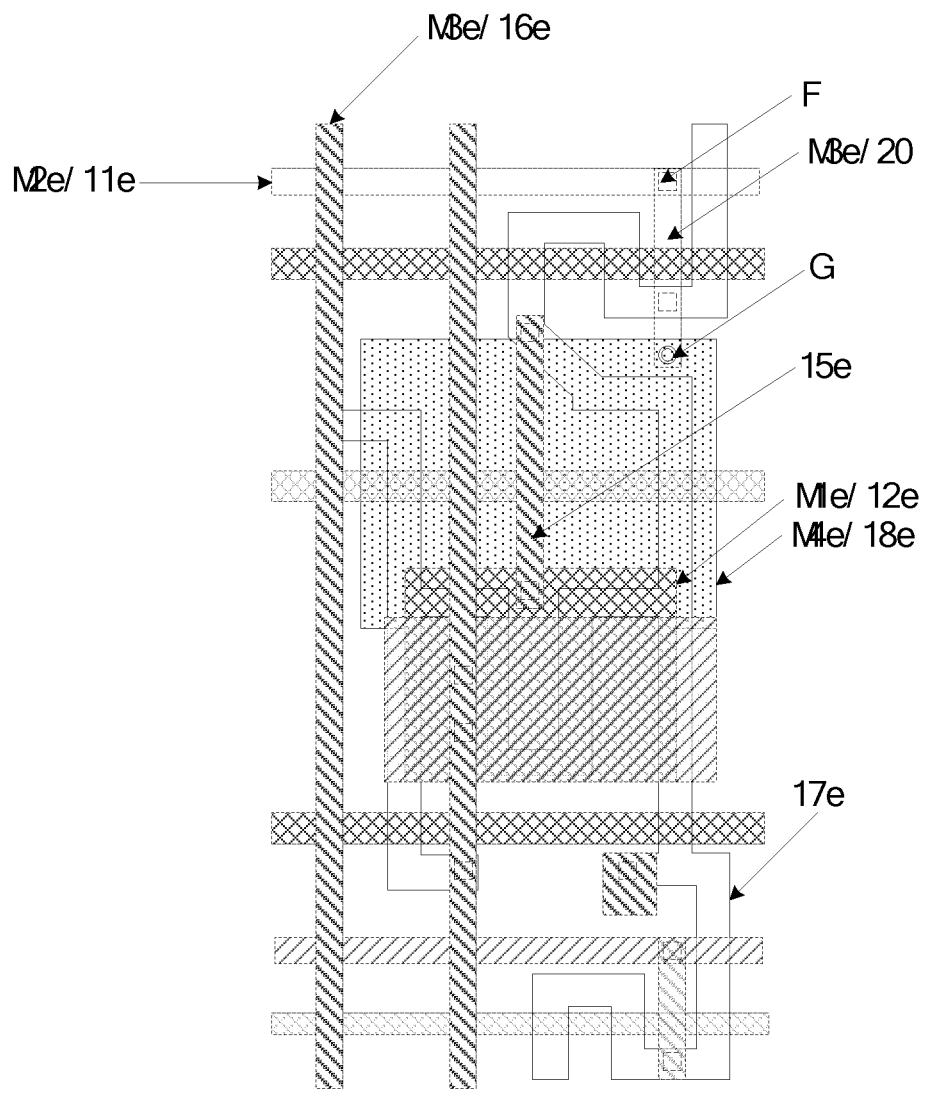
FIG. 8 is a schematic plan view of a display panel according to yet another embodiment of the present disclosure.
Figure 9:
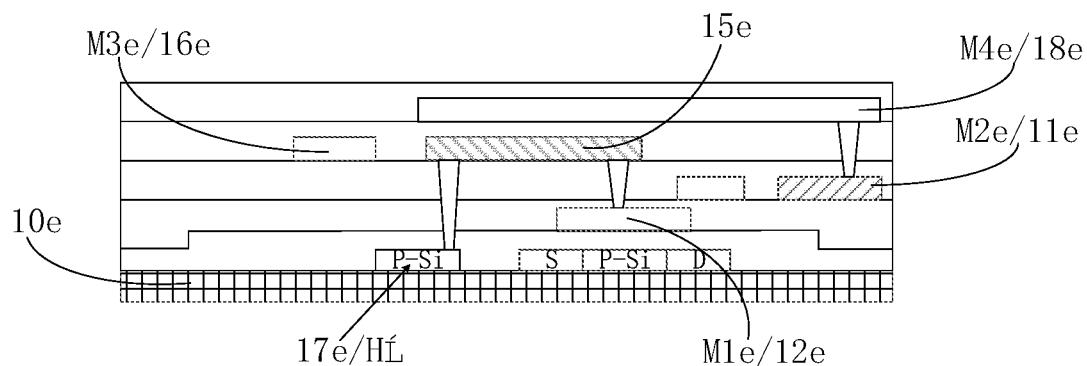
FIG. 9 is a schematic cross-sectional view of the display panel according to an embodiment showing in FIG. 8.

FIG. 8 is a schematic plan view of a display panel according to another embodiment of the present disclosure. FIG. 9 is a schematic cross-sectional view of the display panel according to an embodiment showing in FIG. 8. In yet another embodiment, please refer to FIGS. 8-9, a first shielding electrode 18e is connected to a reference voltage line 11e. The reference voltage line 11e may be located on a second metal layer M2e. The reference voltage line 11e receives a constant DC voltage signal. The reference voltage of the reference voltage line 11e is not easily affected by other signal lines of the display panel and the voltage is not easy to change during the operation of the display panel. In this way, the voltage of a gate 12e of the driving transistor will be maintained in waveform as a stable as possible, and the crosstalk will be alleviated.

In an application scenario, the first shielding electrode 18e is located in a fourth metal layer M4e, and the fourth metal layer M4e is located on one side of a third metal layer M3e away from a substrate 10e. The display panel further includes a second connecting wire 20 located in a third metal layer. One end of the second connecting wire 20 is connected to a reference voltage line 11e through a fifth connecting hole F, and the other end of the second connecting wire 20 is connected to the first shielding electrode 18e through a sixth connection hole G. The above-mentioned design of the first shielding electrode 18e is relatively simple, and the implementation is relatively easy.

In yet another application scenario, as shown in FIG. 9, the display panel includes a first connecting wire 15e which is located in the third metal layer M3e and connected to the gate 12e of the driving transistor. The orthographic projection of the first shielding electrode 18e projected on the substrate 10e may further cover at least part of the orthographic projection of the first connecting line 15e projected on the substrate 10e.

In yet another application scenario, the display panel further includes a semiconductor layer 17e, and a first area H" in the semiconductor layer 17e is connected to the first connection line 15e, as shown in FIG. 9. The projection of the first shielding electrode 18e projected on the substrate 10e can further cover at least part of the projection of the first area H" projected on the substrate 10e. At this time, the second shielding electrode as shown in FIG. 7 can also cover at least part of the first area H".

Figure 10:
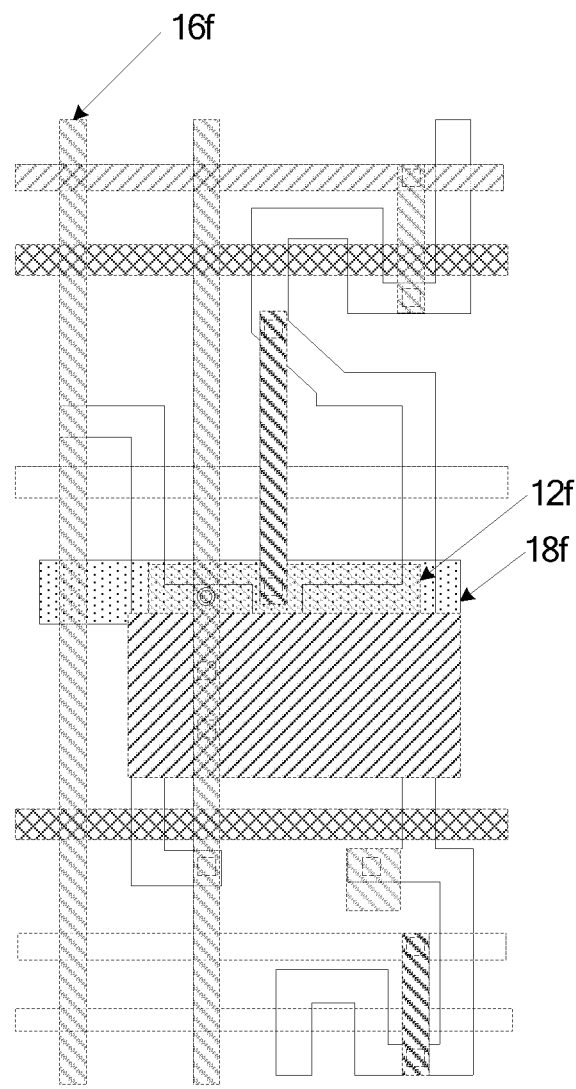
FIG. 10 is a schematic plan view of a display panel according to yet another embodiment of the present disclosure.

FIG. 10 is a schematic plan view a display panel according to yet another embodiment of the present disclosure. In yet another embodiment, please refer to FIG. 10, in order to further decrease the coupling capacitance between a data line 16f and a gate 12f of the driving transistor, the orthographic projection of a first shielding electrode 18f projected on the substrate (not shown in FIG. 10) in the above-mentioned several embodiments is also partially overlapped with the orthographic projection of the data line 16f projected on the substrate.

The following uses specific experimental data to further illustrate the display panel provided in this application.

First, the parasitic capacitance between the data line and the gate of the driving transistor is obtained by software simulation. When the first shielding electrode 18 is not included in the display panel as shown in FIG. 1, the parasitic capacitance coupled between the data line 16 and the gate 12 of the driving transistor is 0.045 fF. When the first shielding electrode 18 is introduced into the display panel, the parasitic capacitance coupled between the data line 16 and the gate 12 of the driving transistor is 0.022 fF, and the parasitic capacitance is reduced by 48%.

Second, actual crosstalk index may be verified. As shown in FIG. 1, when the display panel does not include the first shielding electrode 18, the crosstalk yield is 7/15. When the display panel includes the first shielding electrode 18, the crosstalk yield is 50/50. As can be seen, the crosstalk mitigating is obvious, and the test sample compliance rate is high.

In some embodiments of the present disclosure, a display device may be further disclosed. The display device may include a backlight module and the display panel as previously described.

The above is only some embodiments of the present disclosure, and does not limit the patent scope of the present disclosure. Any equivalent structure or equivalent process transformation made by using the description and the attached drawings of the present disclosure, or directly or indirectly used in other related technical fields, is also included in the protection scope of the present disclosure.

What is claimed is:

1. A display panel, comprising:
   a substrate;
   a first metal layer, located on one side of the substrate and comprising a gate of a driving transistor;
   a second metal layer, located on one side of the first metal layer away from the substrate and comprising a capacitor plate of a storage capacitor, wherein an orthographic projection of the capacitor plate projected on the substrate is partially overlapped with an orthographic projection of the gate projected on the substrate;
   a third metal layer, located on one side of the second metal layer away from the substrate and comprising a data line, wherein an orthographic projection of the data line projected on the substrate is not overlapped with the orthographic projection of the gate projected on the substrate; and
   a first shielding electrode, having a fixed potential, wherein a part of the orthographic projection of the gate projected on the substrate is located in an orthographic projection of the first shielding electrode projected on the substrate, and a rest part of the orthographic projection of the gate projected on the substrate is located in the orthographic projection of the first shielding electrode and the capacitor plate projected on the substrate.

2. The display panel according to claim 1, wherein the third metal layer further comprises a power supply voltage line, and the first shielding electrode is connected to the power supply voltage line.

3. The display panel according to claim 2, wherein the first shielding electrode is located between the third metal layer and the second metal layer; the orthographic projection of the first shielding electrode projected on the substrate and an orthographic projection of the power supply voltage projected on the substrate has an overlapping area therebetween, and the first shielding electrode is connected to the power supply voltage line through a first connection hole.

4. The display panel according to claim 2, wherein the first shielding electrode is located on one side of the third metal layer away from the substrate; the orthographic projection of the first shielding electrode projected on the substrate and an orthographic projection of the power supply voltage projected on the substrate has an overlapping area therebetween, and the first shielding electrode is connected to the power supply voltage line through a second connection hole.

5. The display panel according to claim 4, wherein the third metal layer further comprises a first connection line, wherein the first connection line is connected to the gate through a third connection hole, and the orthographic projection of the first shielding electrode projected on the substrate is at least partially overlapped with an orthographic projection of the first connecting line projected on the substrate.

6. The display panel according to claim 5, further comprising:
   a semiconductor layer, located between the substrate and the first metal layer and having a first area, wherein the first area is connected to the first connection line through a fourth connection hole; wherein the orthographic projection of the first shielding electrode projected on the substrate is at least partially overlapped with an orthographic projection of the first area projected on the substrate.

7. The display panel according to claim 5, further comprising:
   a semiconductor layer, located between the substrate and the first metal layer and comprising a first area, wherein the first area is connected to the first connection line through a fourth connection hole; and
   a second shielding electrode, located in the second metal layer and connected to the power supply voltage line, wherein an orthographic projection of the second shielding electrode projected on the substrate is at least partially overlapped with the orthographic projection of the first area on the substrate.

8. The display panel according to claim 7, wherein the orthographic projection of the second shielding electrode projected on the substrate is at least partially overlapped with orthographic projection of the power supply voltage projected on the substrate.

9. The display panel according to claim 1, wherein the second metal layer further comprises a reference voltage line, and the first shielding electrode is connected to the reference voltage line.

10. The display panel according to claim 8, wherein the third metal layer further comprises a first connection line; wherein the first connection line is electrically connected to the gate, the orthographic projection of the first shielding electrode projected on the substrate is at least partially overlapped with an orthographic projection of the first connecting line projected on the substrate.

11. The display panel according to claim 10, wherein the first shielding electrode is located on one side of the third metal layer away from the substrate; the third metal layer further comprises a second connection line, one end of the second connection line is electrically connected to the reference voltage line, and the other end of the second connection line is electrically connected to the first shielding electrode.

12. The display panel according to claim 10, further comprising:
a semiconductor layer, located between the substrate and the first metal layer and having a first area, wherein the first area is electrically connected to the first connection line; wherein the orthographic projection of the first shielding electrode projected on the substrate is at least partially overlapped with an orthographic projection of the first area projected on the substrate.

13. The display panel according to claim 10, further comprising:
a semiconductor layer, located between the substrate and the first metal layer and comprising a first area, wherein the first area is connected to the first connection line through a fourth connection hole; and
a second shielding electrode, located in the second metal layer and connected to the power supply voltage line, wherein an orthographic projection of the second shielding electrode projected on the substrate is at least partially overlapped with the orthographic projection of the first area on the substrate.

14. The display panel according to claim 1, wherein the orthographic projection of the first shielding electrode projected on the substrate is overlapped with the orthographic projection of the data line projected on the substrate.

15. A display device, comprising a backlight module and the display panel according to claim 1.

16. The display device according to claim 15, wherein the third metal layer further comprises a power supply voltage line, and the first shielding electrode is connected to the power supply voltage line.

17. The display device according to claim 16, wherein the first shielding electrode is located between the third metal layer and the second metal layer, or the first shielding electrode is located on one side of the third metal layer away from the substrate; an overlapping area exists between the orthographic projection of the first shielding electrode projected on the substrate and an orthographic projection of the power supply voltage projected on the substrate, and the first shielding electrode is connected to the power supply voltage line.

18. The display device according to claim 17, wherein the third metal layer further comprises a first connection line, wherein the first connection line is connected to the gate through a third connection hole, and the orthographic projection of the first shielding electrode projected on the substrate is at least partially overlapped with an orthographic projection of the first connecting line projected on the substrate.

19. The display device according to claim 18, further comprising:
a semiconductor layer, located between the substrate and the first metal layer and having a first area, wherein the first area is connected to the first connection line through a fourth connection hole; wherein the orthographic projection of the first shielding electrode projected on the substrate is at least partially overlapped with an orthographic projection of the first area projected on the substrate.

20. A display panel, comprising:
a substrate,
a driving transistor, having a gate disposed on the substrate;
a capacitor plate of a storage capacitor, located on one side of the gate away from the substrate; and
a shielding electrode, wherein an area of the gate of the driving transistor protruding out of the capacitor plate is covered by the shielding electrode, a part of an orthographic projection of the gate projected on the substrate is located in an orthographic projection of the shielding electrode projected on the substrate, and the rest part of the orthographic projection of the gate projected on the substrate is located in an orthographic projection of the capacitor plate projected on the substrate.

* * * * *